United States Patent
Song et al.

(10) Patent No.: US 10,964,406 B2
(45) Date of Patent: Mar. 30, 2021

(54) METHODS OF SCRUBBING ERRORS AND SEMICONDUCTOR MODULES USING THE SAME

(71) Applicant: SK hynix Inc., Gyeonggi-do (KR)

(72) Inventors: Young Ook Song, Seoul (KR); Yong Mi Kim, Gyeonggi-do (KR); Chang Hyun Kim, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 132 days.

(21) Appl. No.: 15/982,378

(22) Filed: May 17, 2018

(65) Prior Publication Data
US 2019/0164626 A1 May 30, 2019

(30) Foreign Application Priority Data

Nov. 24, 2017 (KR) .......................... 10-2017-0158288

(51) Int. Cl.
| | | |
|---|---|---|
| *G06F 11/14* | (2006.01) | |
| *G11C 29/52* | (2006.01) | |
| *G11C 7/02* | (2006.01) | |
| *G11C 29/04* | (2006.01) | |
| *G11C 16/34* | (2006.01) | |

(52) U.S. Cl.
CPC .......... *G11C 29/52* (2013.01); *G06F 11/1471* (2013.01); *G11C 7/02* (2013.01); *G11C 16/34* (2013.01); *G11C 29/04* (2013.01); *G11C 2029/0409* (2013.01); *G11C 2029/0411* (2013.01)

(58) Field of Classification Search
CPC ............. G06F 11/1044; G06F 11/1072; G06F 11/1048; G06F 11/1068; G06F 11/1028; G06F 3/0619; G06F 3/064; G06F 3/0679
See application file for complete search history.

(56) References Cited

U.S. PATENT DOCUMENTS

| | | | | |
|---|---|---|---|---|
| 9,823,964 | B2 * | 11/2017 | Reed ................... | G06F 11/1068 |
| 9,990,163 | B2 * | 6/2018 | Cha ....................... | G06F 11/106 |
| 10,042,700 | B2 * | 8/2018 | Brandl ................ | G06F 11/1068 |
| 2002/0016942 | A1 * | 2/2002 | MacLaren ........... | G06F 11/1076 |
| | | | | 714/718 |
| 2007/0113150 | A1 * | 5/2007 | Resnick ................ | G06F 11/106 |
| | | | | 714/763 |
| 2012/0173826 | A1 * | 7/2012 | Takaku ............... | G06F 11/1666 |
| | | | | 711/148 |
| 2017/0091023 | A1 * | 3/2017 | Gilda ....................... | G11C 29/44 |
| 2017/0123903 | A1 | 5/2017 | Eguchi | |
| 2017/0161144 | A1 * | 6/2017 | Reed ................... | G06F 11/1068 |
| 2018/0018219 | A1 * | 1/2018 | Kim .................... | G06F 11/1068 |
| 2018/0173588 | A1 * | 6/2018 | Bacchus ............... | G06F 11/106 |

FOREIGN PATENT DOCUMENTS

KR 1020120136674 12/2012

\* cited by examiner

*Primary Examiner* — Nadeem Iqbal
(74) *Attorney, Agent, or Firm* — IP & T Group LLP

(57) ABSTRACT

A semiconductor device includes a flag generation circuit and a write operation circuit. The flag generation circuit generates an error scrub flag if an error scrub operation is performed. The write operation circuit controls a write operation in response to the error scrub flag. The error scrub operation includes an internal read operation for outputting read data from a cell array, a data correction operation for correcting an error included in the read data to generate corrected data, and an internal write operation for storing the corrected data into the cell array.

18 Claims, 7 Drawing Sheets

METHODS OF SCRUBBING ERRORS AND SEMICONDUCTOR MODULES USING THE SAME

CROSS-REFERENCE TO RELATED APPLICATIONS

The present application claims priority under 35 U.S.C 119(a) to Korean Application No. 10-2017-0158288, filed on Nov. 24, 2017, which is incorporated herein by reference in its entirety.

BACKGROUND

1. Technical Field

Embodiments of the present disclosure relate to methods of scrubbing errors and semiconductor modules using the same.

2. Related Art

Design schemes receiving and outputting a plurality of data during each clock cycle time have been employed to improve the data transmission speed of semiconductor devices. However, when the transmission speed of the data increases, the probability of errors occurring while the data are being transmitted also increases. For this reason, various design schemes have been proposed to improve the reliability of data transmission at increased transmission speeds.

Typically, whenever data are transmitted in a semiconductor device, an error code capable for detecting errors is generated and transmitted with the data to guarantee the reliability of the data transmission. The error code may typically include an error detection code (EDC) capable of detecting errors and an error correction code (ECC) capable of correcting the errors. However, further improvements are needed.

SUMMARY

According to an embodiment of the present invention, there is provided a semiconductor module capable of performing an error scrubbing operation for improving the reliability of data transmission at increased transmission speeds. The semiconductor module includes a controller operatively coupled to a semiconductor device. The controller controls an error scrub operation and a read operation. The semiconductor device includes a plurality of memory chips, and at least one of the plurality of memory chips performs the error scrub operation during the read operation of the plurality of memory chips.

According to another embodiment of the present invention, there is provided a method of scrubbing errors for a semiconductor module. The semiconductor module may include a controller and a semiconductor device. The semiconductor device may be a semiconductor memory device comprising one or more memory chips. The semiconductor module may be part of a memory system comprising a host operatively coupled to the semiconductor memory device. In an embodiment, the method includes a first step of performing an error scrub operation of any one selected from a plurality of memory chips during a read operation of the plurality of memory chips and a second step of performing the error scrub operation of at least one of the memory chips remaining after excluding the selected memory chip from the plurality of memory chips.

According to another embodiment of the present invention, there is provided a semiconductor module capable of performing an error scrubbing operation for improving the reliability of data transmission at increased transmission speeds. The semiconductor module includes a controller and a semiconductor device. The controller including an error scrub control circuit and configured to control an error scrub operation and a read operation. The semiconductor device operatively coupled to the controller and including a plurality of memory chips, and the error scrub control unit is configured to control the plurality of memory chips so that at least one of the plurality of memory chips performs an error scrub operation during a read operation of the plurality of memory chips.

BRIEF DESCRIPTION OF THE DRAWINGS

Various embodiments of the present disclosure will become more apparent to those skilled in the art of the present invention in view of the attached drawings and accompanying detailed description, in which.

DETAILED DESCRIPTION OF THE EMBODIMENTS

Various embodiments of the present disclosure will be described hereinafter with reference to the accompanying drawings. However, we note that the embodiments described herein are provided for illustrative purposes only and are not intended to limit the scope of the present disclosure.

It is further noted that the drawings are simplified schematics which omit well-known features in order to avoid obfuscating the description of the invention.

Also, as it would be understood by those skilled in the art of the present invention, in some instances a feature described herein in relation to one embodiment may be used in another embodiment.

Figure 1:
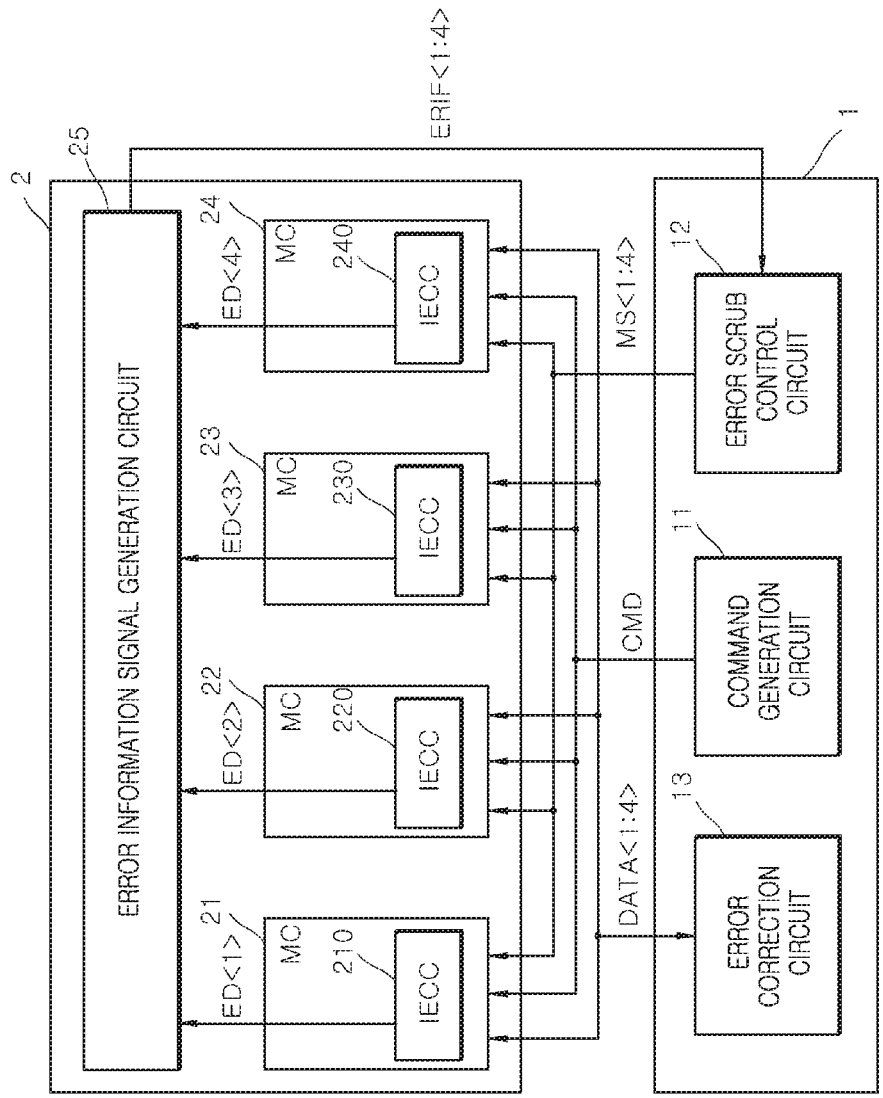
FIG. 1 is a block diagram illustrating a configuration of a semiconductor module, according to an embodiment of the present disclosure.

As illustrated in FIG. 1, a semiconductor module may include a controller 1 and a semiconductor device 2 operatively coupled to each other, according to an embodiment.

The controller 1 may include a command generation circuit 11, an error scrub control circuit 12 and an error correction circuit 13. The error correction circuit 13 is also referred to as a scrub error correction circuit in order to differentiate it from a plurality of internal error correction circuits 210, 220, 230 and 240 found in the semiconductor device 2.

The command generation circuit 11 may generate a command CMD for controlling the semiconductor device 2. The command generation circuit 11 may generate a plurality of various commands CMD, each being specific for an operation of the semiconductor device 2. For example, the command CMD may be a command for a read operation of the semiconductor device 2, or a command for an error scrub operation of the semiconductor device 2, or a command for a write operation of the semiconductor device 2. We note, that although FIG. 1 illustrates the command CMD transmitted to the semiconductor device 2 via a single signal line, this is done for illustrative purposes only and that the present invention is not limited in this way. For example, the command CMD may be transmitted to the semiconductor device 2 through one or more signal lines that transmit at least one group of addresses, commands and data. The read operation may be an operation that reads out data DATA<1:4> stored in the semiconductor device 2. The error scrub operation may be an operation that corrects errors of the data DATA<1:4> stored in the semiconductor device 2 and restores the corrected data into the semiconductor device 2. The write operation may be an operation that stores the data DATA<1:4> outputted from the controller 1 into the semiconductor device 2.

The error scrub control circuit 12 may generate first to fourth memory selection signals MS<1:4>, each of which may be selectively enabled in response to a corresponding one of first to fourth error information signals ERIF<1:4>. The error scrub control circuit 12 may generate the first memory selection signal MS<1> which is enabled when the first error information signal ERIF<1> is enabled. The error scrub control circuit 12 may generate the second memory selection signal MS<2> which is enabled when the second error information signal ERIF<2> is enabled. The error scrub control circuit 12 may generate the third memory selection signal MS<3> which is enabled when the third error information signal ERIF<3> is enabled. The error scrub control circuit 12 may generate the fourth memory selection signal MS<4> which is enabled when the fourth error information signal ERIF<4> is enabled. Although the present embodiment of FIG. 1 illustrates an example in which one of the first to fourth memory selection signals MS<1:4> is selectively enabled, in a modified embodiment, the error scrub control circuit 12 may be realized to enable at least two of the first to fourth memory selection signals MS<1:4> simultaneously.

In a read operation, the error correction circuit 13 may transmit the first to fourth data DATA<1:4> which are received from the semiconductor device 2 to an external device (not shown). In an error scrub operation, the error correction circuit 13 may correct erroneous data of the first to fourth data DATA<1:4> and may store the corrected data into the semiconductor device 2. In a write operation, the error correction circuit 13 may receive the first to fourth data DATA<1:4> from an external device to transmit the first to fourth data DATA<1:4> to the semiconductor device 2.

In an embodiment, the error correction circuit 13 may be realized to be capable of correcting two or more erroneous bits of the first to fourth data DATA<1:4>. The error correction circuit 13 may use an error detection code (EDC) which is capable of detecting errors and an error correction code (ECC) which is capable of correcting the errors.

The controller 1 may be configured to perform the error scrub operation for a specific memory chip of among a plurality of memory chips included in the semiconductor device 2, using a Reed-Solomon (RS) code, according to an embodiment.

For example, the semiconductor device 2 may include a first memory chip 21, a second memory chip 22, a third memory chip 23, a fourth memory chip 24 and an error information signal generation circuit 25.

The first memory chip 21 may include a first internal error correction circuit 210. The first internal error correction circuit 210 of the first memory chip 21 may receive the command CMD and the first memory selection signal MS<1> to generate a first error detection signal ED<1> including a pulse which is created if an error of the first data DATA<1> occurs during the read operation. The first memory chip 21 may perform the read operation or the error scrub operation in response to the command CMD and the first memory selection signal MS<1>. The first memory chip 21 may perform the read operation if the first memory selection signal MS<1> is disabled, in response to the command CMD. The first memory chip 21 may output the first data DATA<1> stored therein during the read operation. The first memory chip 21 may correct an error of the first data DATA<1> stored therein using the first internal error correction circuit 210 and may output the corrected first data, during the read operation. The first memory chip 21 may perform the error scrub operation if the first memory selection signal MS<1> is enabled, in response to the command CMD. The first memory chip 21 may output the first data DATA<1> stored therein during the error scrub operation. The first memory chip 21 may output the first data DATA<1> without correcting errors of the first data DATA<1> during the error scrub operation. The first memory chip 21 may perform the write operation in response to the command CMD. The first memory chip 21 may store the first data DATA<1> outputted from the controller 1 during the write operation. It is noted that although the first data DATA<1> is illustrated herein with a single signal line, the first data DATA<1> may include a plurality of bits.

The second memory chip 22 may include a second internal error correction circuit 220. The second internal error correction circuit 220 of the second memory chip 22 may receive the command CMD and the second memory selection signal MS<2> to generate a second error detection signal ED<2> including a pulse which is created if an error of the second data DATA<2> occurs during the read operation. The second memory chip 22 may perform the read operation or the error scrub operation in response to the command CMD and the second memory selection signal MS<2>. The second memory chip 22 may perform the read operation if the second memory selection signal MS<2> is disabled, in response to the command CMD. The second memory chip 22 may output the second data DATA<2> stored therein during the read operation. The second memory chip 22 may correct an error of the second data DATA<2> stored therein using the second internal error correction circuit 220 and may output the corrected second data, during the read operation. The second memory chip 22 may perform the error scrub operation if the second memory selection signal MS<2> is enabled, in response to the command CMD. The second memory chip 22 may output the second data DATA<2> stored therein during the error scrub operation. The second memory chip 22 may output the second data DATA<2> without correcting errors of the second data DATA<2> during the error scrub operation. The second memory chip 22 may perform the write operation in response to the command CMD. The second memory chip 22 may store the second data DATA<2> outputted from the controller 1 during the write operation. Although the second data DATA<2> is illustrated with a single signal line, the second data DATA<2> may include a plurality of bits according to various embodiments.

The third memory chip 23 may include a third internal error correction circuit 230. The third internal error correction circuit 230 of the third memory chip 23 may receive the command CMD and the third memory selection signal MS<3> to generate a third error detection signal ED<3> including a pulse which is created if an error of the third data DATA<3> occurs during the read operation. The third memory chip 23 may perform the read operation or the error scrub operation in response to the command CMD and the third memory selection signal MS<3>. The third memory chip 23 may perform the read operation if the third memory selection signal MS<3> is disabled, in response to the command CMD. The third memory chip 23 may output the third data DATA<3> stored therein during the read operation. The third memory chip 23 may correct an error of the third data DATA<3> stored therein using the third internal error correction circuit 230 and may output the corrected third data, during the read operation. The third memory chip 23 may perform the error scrub operation if the third memory selection signal MS<3> is enabled, in response to the command CMD. The third memory chip 23 may output the third data DATA<3> stored therein during the error scrub operation. The third memory chip 23 may output the third data DATA<3> without correcting errors of the third data DATA<3> during the error scrub operation. The third memory chip 23 may perform the write operation in response to the command CMD. The third memory chip 23 may store the third data DATA<3> outputted from the controller 1 during the write operation. Although the third data DATA<3> is illustrated with a single signal line, the third data DATA<3> may include a plurality of bits according to various embodiments.

The fourth memory chip 24 may include a fourth internal error correction circuit 240. The fourth internal error correction circuit 240 of the fourth memory chip 24 may receive the command CMD and the fourth memory selection signal MS<4> to generate a fourth error detection signal ED<4> including a pulse which is created if an error of the fourth data DATA<4> occurs during the read operation. The fourth memory chip 24 may perform the read operation or the error scrub operation in response to the command CMD and the fourth memory selection signal MS<4>. The fourth memory chip 24 may perform the read operation if the fourth memory selection signal MS<4> is disabled, in response to the command CMD. The fourth memory chip 24 may output the fourth data DATA<4> stored therein during the read operation. The fourth memory chip 24 may correct an error of the fourth data DATA<4> stored therein using the fourth internal error correction circuit 240 and may output the corrected fourth data, during the read operation. The fourth memory chip 24 may perform the error scrub operation if the fourth memory selection signal MS<4> is enabled, in response to the command CMD. The fourth memory chip 24 may output the fourth data DATA<4> stored therein during the error scrub operation. The fourth memory chip 24 may output the fourth data DATA<4> without correcting errors of the fourth data DATA<4> during the error scrub operation. The fourth memory chip 24 may perform the write operation in response to the command CMD. The fourth memory chip 24 may store the fourth data DATA<4> outputted from the controller 1 during the write operation. Although the fourth data DATA<4> is illustrated with a single signal line, the fourth data DATA<4> may include a plurality of bits according to various embodiments.

Each of the first to fourth internal error correction circuits 210, 220, 230 and 240 may be realized using an error correction circuit that corrects a single erroneous bit of any one of the first to fourth data DATA<1:4> using an error detection code (EDC) which is capable of detecting an error and an error correction code (ECC) which is capable of correcting the error.

The error information signal generation circuit 25 may generate the first to fourth error information signals ERIF<1: 4>, one of which is enabled when a pulse of any one of the first to fourth error detection signals ED<1:4> is created by at least a predetermined number of times. For example, the error information signal generation circuit 25 may generate the first error information signal ERIF<1> which is enabled when a pulse of the first error detection signal ED<1> is created by at least the predetermined number of times, and the error information signal generation circuit 25 may generate the second error information signal ERIF<2> which is enabled when a pulse of the second error detection signal ED<2> is created by at least the predetermined number of times. In addition, the error information signal generation circuit 25 may generate the third error information signal ERIF<3> which is enabled when a pulse of the third error detection signal ED<3> is created by at least the predetermined number of times, and the error information signal generation circuit 25 may generate the fourth error information signal ERIF<4> which is enabled when a pulse of the fourth error detection signal ED<4> is created by at least the predetermined number of times.

Figure 2:
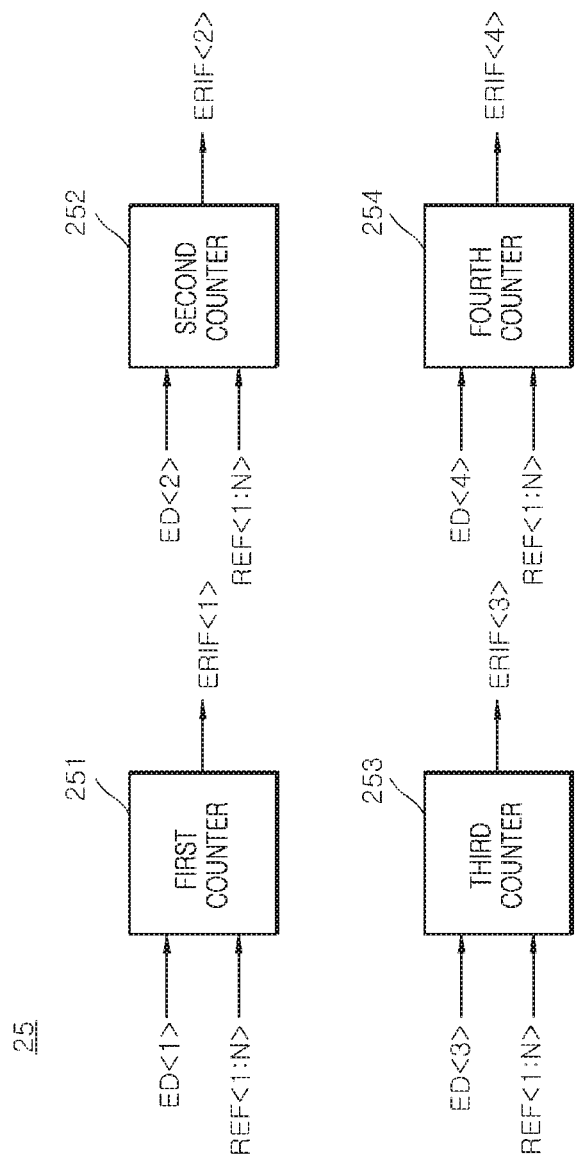
FIG. 2 is a block diagram illustrating an exemplary configuration of an error information signal generation circuit included in the semiconductor module shown in FIG. 1.

Referring to FIG. 2, the error information signal generation circuit 25 may include a first counter 251, a second counter 252, a third counter 253 and a fourth counter 254.

The first counter 251 may receive a reference information signal REF<1:N> to generate the first error information signal ERIF<1> which is enabled when a pulse of the first error detection signal ED<1> is created at least the predetermined number of times. The first counter 251 may generate the first error information signal ERIF<1> which is enabled when a pulse generation number of times of the first error detection signal ED<1> is equal to or greater than a predetermined pulse generation number of times that is set by the reference information signal REF<1:N>. The reference information signal REF<1:N> may be set to include information on the predetermined pulse generation number of times. The number of bits included in the reference information signal REF<1:N> may be set to be different according to various embodiments. After a pulse of the first error detection signal ED<1> is created by at least the predetermined number of times, the first counter 251 may be initialized to generate the first error information signal ERIF<1> which is disabled. In an embodiment, the reference information signal REF<1:N> may be stored in the semiconductor device 2. In another embodiment, the reference information signal REF<1:N> may be provided by an external device.

The second counter 252 may receive the reference information signal REF<1:N> to generate the second error information signal ERIF<2> which is enabled when a pulse of the second error detection signal ED<2> is created at least the predetermined number of times. The second counter 252 may generate the second error information signal ERIF<2> which is enabled when a pulse generation number of times of the second error detection signal ED<2> is equal to or greater than the predetermined pulse generation number of times that is set by the reference information signal REF<1:N>. After a pulse of the second error detection signal ED<2> is created by at least the predetermined number of times, the second counter 252 may be initialized to generate the second error information signal ERIF<2> which is disabled.

The third counter 253 may receive the reference information signal REF<1:N> to generate the third error information signal ERIF<3> which is enabled when a pulse of the third error detection signal ED<3> is created at least the predetermined number of times. The third counter 253 may generate the third error information signal ERIF<3> which is enabled when a pulse generation number of times of the third error detection signal ED<3> is equal to or greater than the predetermined pulse generation number of times that is set by the reference information signal REF<1:N>. After a pulse of the third error detection signal ED<3> is created by at least the predetermined number of times, the third counter 253 may be initialized to generate the third error information signal ERIF<3> which is disabled.

The fourth counter 254 may receive the reference information signal REF<1:N> to generate the fourth error information signal ERIF<4> which is enabled when a pulse of the fourth error detection signal ED<4> is created at least the predetermined number of times. The fourth counter 254 may generate the fourth error information signal ERIF<4> which is enabled when a pulse generation number of times of the fourth error detection signal ED<4> is equal to or greater than the predetermined pulse generation number of times that is set by the reference information signal REF<1:N>. After a pulse of the fourth error detection signal ED<4> is created by at least the predetermined number of times, the fourth counter 254 may be initialized to generate the fourth error information signal ERIF<4> which is disabled.

Figure 3:
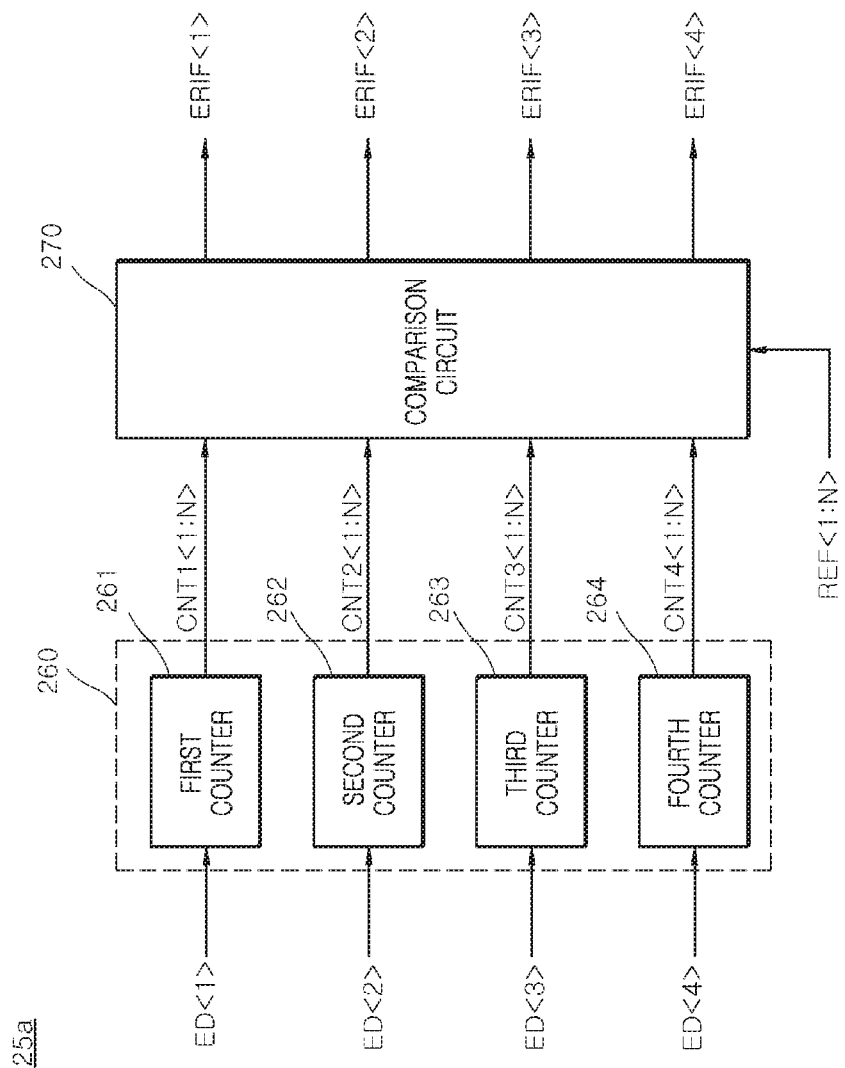
FIG. 3 is a block diagram illustrating another exemplary configuration of an error information signal generation circuit included in the semiconductor module shown in FIG. 1.

Referring to FIG. 3, an error information signal generation circuit 25a corresponding to another example of the error information signal generation circuit 25 of FIG. 1 may include a count signal generation circuit 260 and a comparison circuit 270.

The count signal generation circuit 260 may include a first counter 261, a second counter 262, a third counter 263 and a fourth counter 264.

The first counter 261 may generate a first count signal CNT1<1:N> that is counted in response to a pulse of the first error detection signal ED<1>. The first counter 261 may generate the first count signal CNT1<1:N> that is sequentially counted up each time a pulse of the first error detection signal ED<1> is created.

The second counter 262 may generate a second count signal CNT2<1:N> that is counted in response to a pulse of the second error detection signal ED<2>. The second counter 262 may generate the second count signal CNT2<1:N> that is sequentially counted up each time a pulse of the second error detection signal ED<2> is created.

The third counter 263 may generate a third count signal CNT3<1:N> that is counted in response to a pulse of the third error detection signal ED<3>. The third counter 263 may generate the third count signal CNT3<1:N> that is sequentially counted up each time a pulse of the third error detection signal ED<3> is created.

The fourth counter 264 may generate a fourth count signal CNT4<1:N> that is counted in response to a pulse of the fourth error detection signal ED<4>. The fourth counter 264 may generate the fourth count signal CNT4<1:N> that is sequentially counted up each time a pulse of the fourth error detection signal ED<4> is created.

The comparison circuit 270 may compare the first count signal CNT1<1:N> with the reference information signal REF<1:N> to generate the first error information signal ERIF<1>. The comparison circuit 270 may generate the first error information signal ERIF<1> which is enabled if the first count signal CNT1<1:N> is counted to have a value which is equal to or greater than a value corresponding to a combination of the reference information signal REF<1:N>. The comparison circuit 270 may compare the second count signal CNT2<1:N> with the reference information signal REF<1:N> to generate the second error information signal ERIF<2>. The comparison circuit 270 may generate the second error information signal ERIF<2> which is enabled if the second count signal CNT2<1:N> is counted to have a value which is equal to or greater than a value corresponding to a combination of the reference information signal REF<1:N>. The comparison circuit 270 may compare the third count signal CNT3<1:N> with the reference information signal REF<1:N> to generate the third error information signal ERIF<3>. The comparison circuit 270 may generate the third error information signal ERIF<3> which is enabled if the third count signal CNT3<1:N> is counted to have a value which is equal to or greater than a value corresponding to a combination of the reference information signal REF<1:N>. The comparison circuit 270 may compare the fourth count signal CNT4<1:N> with the reference information signal REF<1:N> to generate the fourth error information signal ERIF<4>. The comparison circuit 270 may generate the fourth error information signal ERIF<4> which is enabled if the fourth count signal CNT4<1:N> is counted to have a value which is equal to or greater than a value corresponding to a combination of the reference information signal REF<1:N>. The reference information signal REF<1:N> may be set to include information on the predetermined pulse generation number of times. The number of bits included in the reference information signal REF<1:N> may be set to be different according to various embodiments.

Operations of the semiconductor module illustrated in FIGS. 1 to 3 will be described hereinafter in conjunction with an example in which the error scrub operation is performed if an error of the second memory chip 22 occurs at least the predetermined number of times during the read operation.

The command generation circuit 11 may generate the command CMD for the read operation of the semiconductor device 2.

The first memory chip 21 may perform the read operation to output the first data DATA<l> stored in the first memory chip 21, in response to the command CMD. The first internal error correction circuit 210 of the first memory chip 21 may receive the command CMD to generate the first error detection signal ED<1> including a pulse which is created if an error of the first data DATA<1> occurs during the read operation.

The error information signal generation circuit 25 may generate the first error information signal ERIF<1> which is disabled because a pulse of the first error detection signal ED<1> is not created by at least the predetermined number of times.

The error scrub control circuit 12 may generate the first memory selection signal MS<1> which is disabled in response to the first error information signal ERIF<1>.

The first internal error correction circuit 210 of the first memory chip 21 may correct the error of the first data DATA<1> to output the corrected first data, in response to the first memory selection signal MS<1> which is disabled.

The error correction circuit 13 may output the corrected first data to an external device.

The second memory chip 22 may perform the read operation to output the second data DATA<2> stored in the second memory chip 22, in response to the command CMD. The second internal error correction circuit 220 of the second memory chip 22 may receive the command CMD to generate the second error detection signal ED<2> including a pulse which is created if an error of the second data DATA<2> occurs during the read operation.

The error information signal generation circuit 25 may generate the second error information signal ERIF<2> which is enabled because a pulse of the second error detection signal ED<2> is created by at least the predetermined number of times.

The error scrub control circuit 12 may generate the second memory selection signal MS<2> which is enabled in response to the second error information signal ERIF<2>.

The second internal error correction circuit 220 of the second memory chip 22 may output the second data DATA<2> without correcting errors of the second data DATA<2> in response to the second memory selection signal MS<2> which is enabled.

The error correction circuit 13 may correct the errors of the second data DATA<2> and may store the corrected second data in the error correction circuit 13.

The third memory chip 23 may perform the read operation to output the third data DATA<3> stored in the third memory chip 23, in response to the command CMD. The third internal error correction circuit 230 of the third memory chip 23 may receive the command CMD to generate the third error detection signal ED<3> including a pulse which is created if an error of the third data DATA<3> occurs during the read operation.

The error information signal generation circuit 25 may generate the third error information signal ERIF<3> which is disabled because a pulse of the third error detection signal ED<3> is not created by at least the predetermined number of times.

The error scrub control circuit 12 may generate the third memory selection signal MS<3> which is disabled in response to the third error information signal ERIF<3>.

The third internal error correction circuit 230 of the third memory chip 23 may correct the error of the third data DATA<3> to output the corrected third data, in response to the third memory selection signal MS<3> which is disabled.

The error correction circuit 13 may output the corrected third data to an external device.

The fourth memory chip 24 may perform the read operation to output the fourth data DATA<4> stored in the fourth memory chip 24, in response to the command CMD. The fourth internal error correction circuit 240 of the fourth memory chip 24 may receive the command CMD to generate the fourth error detection signal ED<4> including a pulse which is created if an error of the fourth data DATA<4> occurs during the read operation.

The error information signal generation circuit 25 may generate the fourth error information signal ERIF<4> which is disabled because a pulse of the fourth error detection signal ED<4> is not created by at least the predetermined number of times.

The error scrub control circuit 12 may generate the fourth memory selection signal MS<4> which is disabled in response to the fourth error information signal ERIF<4>.

The fourth internal error correction circuit 240 of the fourth memory chip 24 may correct the error of the fourth data DATA<4> to output the corrected fourth data, in response to the fourth memory selection signal MS<4> which is disabled.

The error correction circuit 13 may output the corrected fourth data to an external device.

As described above, a semiconductor module according to an embodiment may perform an error scrub operation of at least one memory chip, in which an error is created while read operations of a plurality of memory chips are performed. Thus, the semiconductor module may not require an additional time for separately performing the error scrub operation, thereby reducing an operation time of the semiconductor module.

Figure 4:
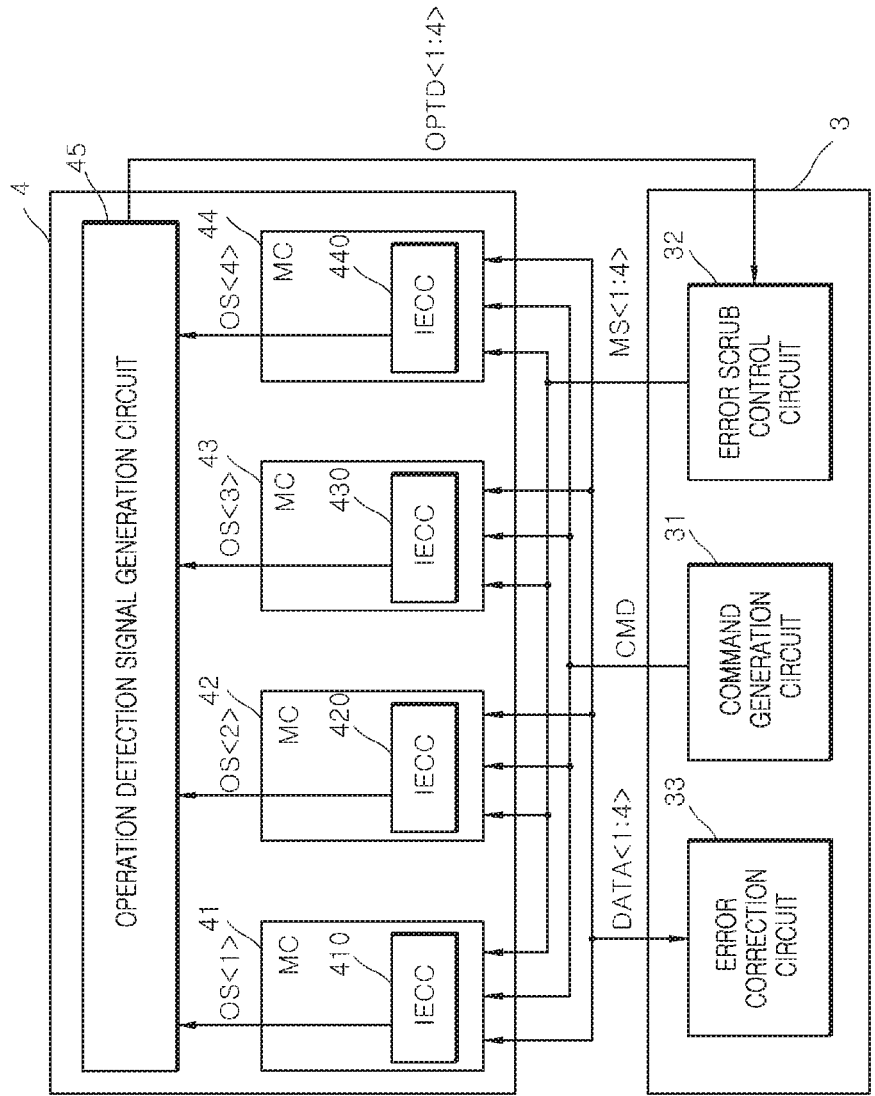
FIG. 4 is a block diagram illustrating a configuration of a semiconductor module, according to another embodiment of the present disclosure.

As illustrated in FIG. 4, a semiconductor module according to another embodiment may include a controller 3 and a semiconductor device 4.

The controller 3 may include a command generation circuit 31, an error scrub control circuit 32 and an error correction circuit 33 (also referred to as a scrub error correction circuit).

The command generation circuit 31 may generate a command CMD for controlling the semiconductor device 4. The command CMD may be a command for a read operation of the semiconductor device 4, or a command for an error scrub operation of the semiconductor device 4, or a command for a write operation of the semiconductor device 4. The command generation circuit 31 may generate a plurality of commands CMD, each being specific for an operation of the semiconductor device 4. Although FIG. 4 illustrates the command CMD being transmitted to the semiconductor device 4 via a single signal line the invention is not limited in this way. For example, the command CMD may be transmitted through one or more signal lines that transmit at least one group of addresses, commands and data. The read operation may be an operation that reads out data DATA<1:4> stored in the semiconductor device 4. The error scrub operation may be an operation that corrects errors of the data DATA<1:4> stored in the semiconductor device 4 and restores the corrected data into the semiconductor device 4. The write operation may be an operation that stores the data DATA<1:4> outputted from the controller 3 into the semiconductor device 4.

The error scrub control circuit 32 may generate first to fourth memory selection signals MS<1:4> which are sequentially enabled in response to first to fourth operation detection signals OPTD<1:4>. The error scrub control circuit 32 may generate the first memory selection signal MS<1> which is enabled when the fourth operation detection signal OPTD<4> is enabled. The error scrub control circuit 32 may generate the second memory selection signal MS<2> which is enabled when the first operation detection signal OPTD<1> is enabled. The error scrub control circuit 32 may generate the third memory selection signal MS<3> which is enabled when the second operation detection signal OPTD<2> is enabled. The error scrub control circuit 32 may generate the fourth memory selection signal MS<4> which is enabled when the third operation detection signal OPTD<3> is enabled. The first to fourth operation detection signals OPTD<1:4> may be set to include information on operations of first to fourth memory chips 41, 42, 43 and 44 included in the semiconductor device 4. For example, enablement of the fourth operation detection signal OPTD<4> may mean termination of the error scrub operation of the fourth memory chip 44.

The error correction circuit 33 may transmit the first to fourth data DATA<1:4> outputted from the semiconductor device 4 to an external device while the read operation is performed. The error correction circuit 33 may correct erroneous data of the first to fourth data DATA<1:4> and may store the corrected data into the semiconductor device 4, while the error scrub operation is performed. The error correction circuit 33 may receive the first to fourth data DATA<1:4> from an external device to transmit the first to fourth data DATA<1:4> to the semiconductor device 4 while the write operation is performed.

The error correction circuit 33 may be realized using an error correction circuit that corrects two or more erroneous bits of the first to fourth data DATA<1:4> using an error detection code (EDC) which is capable of detecting errors and an error correction code (ECC) which is capable of correcting the errors.

The controller 3 may be configured to perform the error scrub operation for a specific memory chip among the first to fourth memory chips 41, 42, 43 and 44 included in the semiconductor device 4, using a Reed-Solomon (RS) code according to various embodiments.

The semiconductor device 4 may include the first to fourth memory chips 41, 42, 43 and 44 and an operation detection signal generation circuit 45.

The first memory chip 41 may include a first internal error correction circuit 410. The first internal error correction circuit 410 of the first memory chip 41 may generate a first operation start signal OS<1> which is enabled during the error scrub operation in response to the command CMD and the first memory selection signal MS<1>. The first memory chip 41 may perform the read operation or the error scrub operation in response to the command CMD and the first memory selection signal MS<1>. The first memory chip 41 may perform the read operation if the first memory selection signal MS<1> is disabled, in response to the command CMD. The first memory chip 41 may output the first data DATA<1> stored therein during the read operation. The first memory chip 41 may correct an error of the first data DATA<1> stored therein using the first internal error correction circuit 410 and may output the corrected first data, during the read operation. The first memory chip 41 may perform the error scrub operation if the first memory selection signal MS<1> is enabled, in response to the command CMD. The first memory chip 41 may output the first data DATA<1> stored therein during the error scrub operation. The first memory chip 41 may output the first data DATA<1> without correcting errors of the first data DATA<1> during the error scrub operation. The first memory chip 41 may perform the write operation in response to the command CMD. The first memory chip 41 may store the first data DATA<1> outputted from the controller 3 during the write operation. Although the first data DATA<1> is illustrated with a single signal line, the first data DATA<1> may include a plurality of bits according to various embodiments. The first operation start signal OS<1> may be set to be enabled at a point of time that the error scrub operation of the first memory chip 41 starts.

The second memory chip 42 may include a second internal error correction circuit 420. The second internal error correction circuit 420 of the second memory chip 42 may generate a second operation start signal OS<2> which is enabled during the error scrub operation in response to the command CMD and the second memory selection signal MS<2>. The second memory chip 42 may perform the read operation or the error scrub operation in response to the command CMD and the second memory selection signal MS<2>. The second memory chip 42 may perform the read operation if the second memory selection signal MS<2> is disabled, in response to the command CMD. The second memory chip 42 may output the second data DATA<2> stored therein during the read operation. The second memory chip 42 may correct an error of the second data DATA<2> stored therein using the second internal error correction circuit 420 and may output the corrected second data, during the read operation. The second memory chip 42 may perform the error scrub operation if the second memory selection signal MS<2> is enabled, in response to the command CMD. The second memory chip 42 may output the second data DATA<2> stored therein during the error scrub operation. The second memory chip 42 may output the second data DATA<2> without correcting errors of the second data DATA<2> during the error scrub operation. The second memory chip 42 may perform the write operation in response to the command CMD. The second memory chip 42 may store the second data DATA<2> outputted from the controller 3 during the write operation. Although the second data DATA<2> is illustrated with a single signal line, the second data DATA<2> may include a plurality of bits according to various embodiments. The second operation start signal OS<2> may be set to be enabled at a point of time that the error scrub operation of the second memory chip 42 starts.

The third memory chip 43 may include a third internal error correction circuit 430. The third internal error correction circuit 430 of the third memory chip 43 may generate a third operation start signal OS<3> which is enabled during the error scrub operation in response to the command CMD and the third memory selection signal MS<3>. The third memory chip 43 may perform the read operation or the error scrub operation in response to the command CMD and the third memory selection signal MS<3>. The third memory chip 43 may perform the read operation if the third memory selection signal MS<3> is disabled, in response to the command CMD. The third memory chip 43 may output the third data DATA<3> stored therein during the read operation. The third memory chip 43 may correct an error of the third data DATA<3> stored therein using the third internal error correction circuit 430 and may output the corrected third data, during the read operation. The third memory chip 43 may perform the error scrub operation if the third memory selection signal MS<3> is enabled, in response to the command CMD. The third memory chip 43 may output the third data DATA<3> stored therein during the error scrub operation. The third memory chip 43 may output the third data DATA<3> without correcting errors of the third data DATA<3> during the error scrub operation. The third memory chip 43 may perform the write operation in response to the command CMD. The third memory chip 43 may store the third data DATA<3> outputted from the controller 3 during the write operation. Although the third data DATA<3> is illustrated with a single signal line, the third data DATA<3> may include a plurality of bits according to various embodiments. The third operation start signal OS<3> may be set to be enabled at a point of time that the error scrub operation of the third memory chip 43 starts.

The fourth memory chip 44 may include a fourth internal error correction circuit 440. The fourth internal error correction circuit 440 of the fourth memory chip 44 may generate a fourth operation start signal OS<4> which is enabled during the error scrub operation in response to the command CMD and the fourth memory selection signal MS<4>. The fourth memory chip 44 may perform the read operation or the error scrub operation in response to the command CMD and the fourth memory selection signal MS<4>. The fourth memory chip 44 may perform the read operation if the fourth memory selection signal MS<4> is disabled, in response to the command CMD. The fourth memory chip 44 may output the fourth data DATA<4> stored therein during the read operation. The fourth memory chip 44 may correct an error of the fourth data DATA<4> stored therein using the fourth internal error correction circuit 440 and may output the corrected fourth data, during the read operation. The fourth memory chip 44 may perform the error scrub operation if the fourth memory selection signal MS<4> is enabled, in response to the command CMD. The fourth memory chip 44 may output the fourth data DATA<4> stored therein during the error scrub operation. The fourth memory chip 44 may output the fourth data DATA<4> without correcting errors of the fourth data DATA<4> during the error scrub operation. The fourth memory chip 44 may perform the write operation in response to the command CMD. The fourth memory chip 44 may store the fourth data DATA<4> outputted from the controller 3 during the write operation. Although the fourth data DATA<4> is illustrated with a single signal line, the fourth data DATA<4> may include a plurality of bits according to various embodiments. The fourth operation start signal OS<4> may be set to be enabled at a point of time that the error scrub operation of the fourth memory chip 44 starts.

Meanwhile, each of the first to fourth internal error correction circuits 410, 420, 430 and 440 may be realized using an error correction circuit that corrects a single erroneous bit of any one of the first to fourth data DATA<1:4> using an error detection code (EDC) which is capable of detecting an error and an error correction code (ECC) which is capable of correcting the error.

The operation detection signal generation circuit 45 may generate the first to fourth operation detection signals OPTD<1:4> which are enabled when a predetermined period from a point of time that the first to fourth operation start signals OS<1:4> are inputted to the operation detection signal generation circuit 45. The operation detection signal generation circuit 45 may generate the first operation detection signal OPTD<1> which is enabled after the predetermined period from a point of time that the first operation start signal OS<1> is inputted to the operation detection signal generation circuit 45. The operation detection signal generation circuit 45 may generate the second operation detection signal OPTD<2> which is enabled after the predetermined period from a point of time that the second operation start signal OS<2> is inputted to the operation detection signal generation circuit 45. The operation detection signal generation circuit 45 may generate the third operation detection signal OPTD<3> which is enabled after the predetermined period from a point of time that the third operation start signal OS<3> is inputted to the operation detection signal generation circuit 45. The operation detection signal generation circuit 45 may generate the fourth operation detection signal OPTD<4> which is enabled after the predetermined period from a point of time that the fourth operation start signal OS<4> is inputted to the operation detection signal generation circuit 45.

Figure 5:
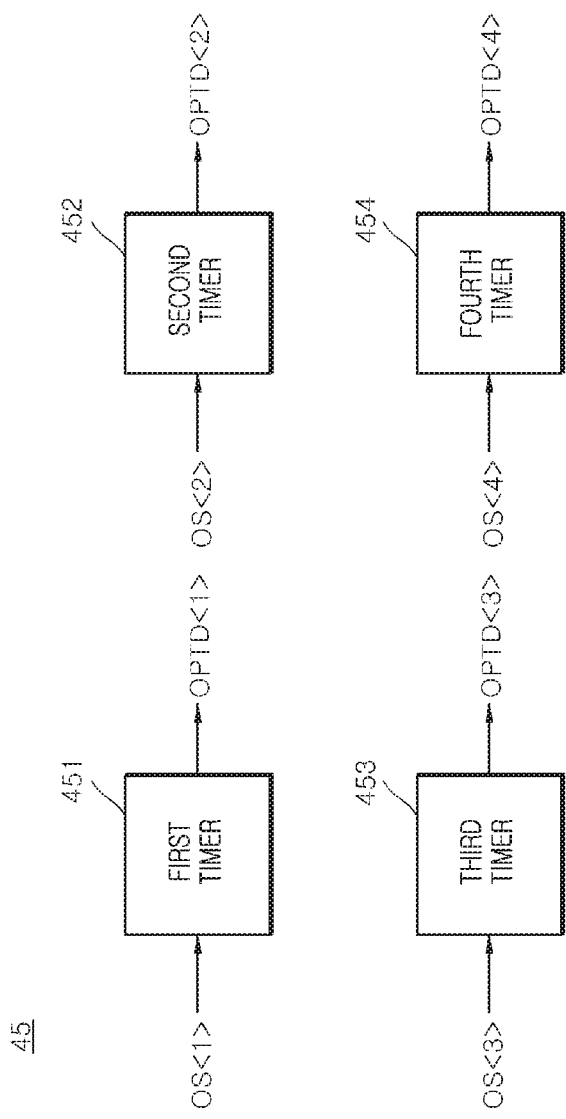
FIG. 5 is a block diagram illustrating an exemplary configuration of an operation detection signal generation circuit included in the semiconductor module shown in FIG. 4.

Referring to FIG. 5, the operation detection signal generation circuit 45 may include a first timer 451, a second timer 452, a third timer 453 and a fourth timer 454.

The first timer 451 may generate the first operation detection signal OPTD<1> which is enabled in response to the first operation start signal OS<1>. The first timer 451 may generate the first operation detection signal OPTD<1> which is enabled after the predetermined period from a point of time that the first operation start signal OS<1> is inputted to the first timer 451.

The second timer 452 may generate the second operation detection signal OPTD<2> which is enabled in response to the second operation start signal OS<2>. The second timer 452 may generate the second operation detection signal OPTD<2> which is enabled after the predetermined period from a point of time that the second operation start signal OS<2> is inputted to the second timer 452.

The third timer 453 may generate the third operation detection signal OPTD<3> which is enabled in response to the third operation start signal OS<3>. The third timer 453 may generate the third operation detection signal OPTD<3> which is enabled after the predetermined period from a point of time that the third operation start signal OS<3> is inputted to the third timer 453.

The fourth timer 454 may generate the fourth operation detection signal OPTD<4> which is enabled in response to the fourth operation start signal OS<4>. The fourth timer 454 may generate the fourth operation detection signal OPTD<4> which is enabled after the predetermined period from a point of time that the fourth operation start signal OS<4> is inputted to the fourth timer 454.

Operations of the semiconductor module illustrated in FIGS. 4 and 5 will be described hereinafter in conjunction with an example in which all of the memory chips in the semiconductor module sequentially perform the error scrub operation during the read operation.

The command generation circuit 31 may generate the command CMD for the read operation of the semiconductor device 4.

The first memory chip 41 may perform the error scrub operation in response to the command CMD and the first memory selection signal MS<1>. The first memory chip 41 may output the first data DATA<1> without correcting errors of the first data DATA<1>. The first internal error correction circuit 410 of the first memory chip 41 may receive the command CMD and the first memory selection signal MS<1> to generate the first operation start signal OS<1> which is enabled during the error scrub operation.

The error correction circuit 33 may correct the errors of the first data DATA<1> and may transmit the corrected first data to the first memory chip 41 so that the first memory chip 41 stores the corrected first data.

The operation detection signal generation circuit 45 may generate the first operation detection signal OPTD<1> which is enabled after the predetermined period from a point of time that the first operation start signal OS<1> is inputted to the operation detection signal generation circuit 45.

The error scrub control circuit 32 may generate the second memory selection signal MS<2> which is enabled if the first operation detection signal OPTD<1> is enabled.

The second memory chip 42 may perform the error scrub operation in response to the command CMD and the second memory selection signal MS<2>. The second memory chip 42 may output the second data DATA<2> without correcting errors of the second data DATA<2>. The second internal error correction circuit 420 of the second memory chip 42 may receive the command CMD and the second memory selection signal MS<2> to generate the second operation start signal OS<2> which is enabled during the error scrub operation.

The error correction circuit 33 may correct the errors of the second data DATA<2> and may transmit the corrected second data to the second memory chip 42 so that the second memory chip 42 stores the corrected second data.

The operation detection signal generation circuit 45 may generate the second operation detection signal OPTD<2> which is enabled after the predetermined period from a point of time that the second operation start signal OS<2> is inputted to the operation detection signal generation circuit 45.

The error scrub control circuit 32 may generate the third memory selection signal MS<3> which is enabled if the second operation detection signal OPTD<2> is enabled.

The third memory chip 43 may perform the error scrub operation in response to the command CMD and the third memory selection signal MS<3>. The third memory chip 43 may output the third data DATA<3> without correcting errors of the third data DATA<3>. The third internal error correction circuit 430 of the third memory chip 43 may receive the command CMD and the third memory selection signal MS<3> to generate the third operation start signal OS<3> which is enabled during the error scrub operation.

The error correction circuit 33 may correct the errors of the third data DATA<3> and may transmit the corrected third data to the third memory chip 43 so that the third memory chip 43 stores the corrected third data.

The operation detection signal generation circuit 45 may generate the third operation detection signal OPTD<3> which is enabled after the predetermined period from a point of time that the third operation start signal OS<3> is inputted to the operation detection signal generation circuit 45.

The error scrub control circuit 32 may generate the fourth memory selection signal MS<4> which is enabled if the third operation detection signal OPTD<3> is enabled.

The fourth memory chip 44 may perform the error scrub operation in response to the command CMD and the fourth memory selection signal MS<4>. The fourth memory chip 44 may output the fourth data DATA<4> without correcting errors of the fourth data DATA<4>. The fourth internal error correction circuit 440 of the fourth memory chip 44 may receive the command CMD and the fourth memory selection signal MS<4> to generate the fourth operation start signal OS<4> which is enabled during the error scrub operation.

The error correction circuit 33 may correct the errors of the fourth data DATA<4> and may transmit the corrected fourth data to the fourth memory chip 44 so that the fourth memory chip 44 stores the corrected fourth data.

The operation detection signal generation circuit 45 may generate the fourth operation detection signal OPTD<4> which is enabled after the predetermined period from a point of time that the fourth operation start signal OS<4> is inputted to the operation detection signal generation circuit 45.

The error scrub control circuit 32 may generate the first memory selection signal MS<1> which is enabled if the fourth operation detection signal OPTD<4> is enabled.

Subsequently, the first memory chip 41 may perform the error scrub operation described above.

As described above, a semiconductor module according to another embodiment may sequentially perform error scrub operations of all of memory chips included in the semiconductor module while read operations of all of the memory chips are performed. Thus, the semiconductor module may not require an additional time for separately performing the error scrub operation, thereby reducing an operation time of the semiconductor module.

Figure 6:
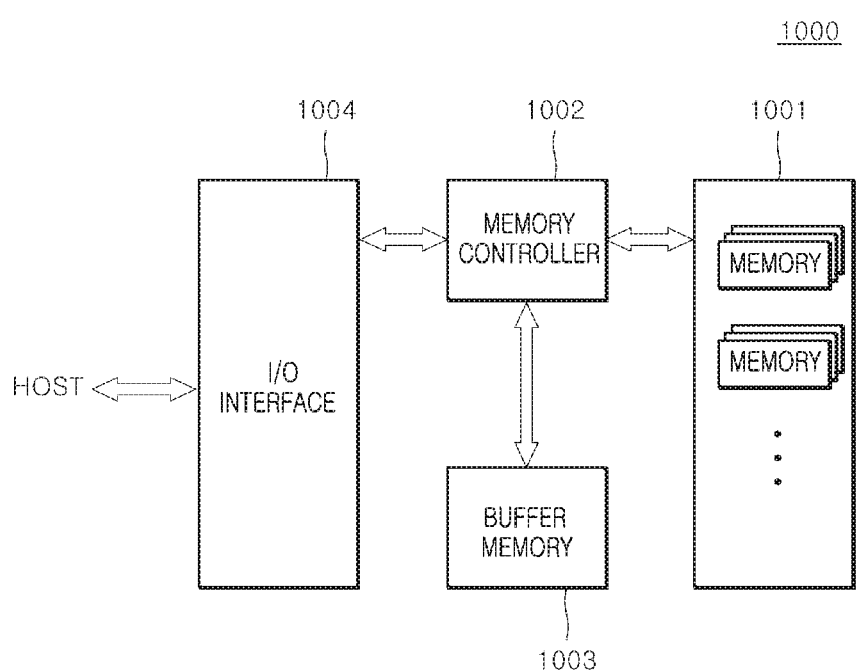
FIG. 6 is a block diagram illustrating a configuration of an electronic system employing at least one of the semiconductor modules shown in FIGS. 1 to 5.

At least one of the semiconductor modules described with reference to FIGS. 1 to 5 may be applied to an electronic system that includes a memory system, a graphic system, a computing system, a mobile system, or the like. For example, as illustrated in FIG. 6, an electronic system 1000 according to an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal outputted from the memory controller 1002. The data storage circuit 1001 may include the semiconductor device 2 illustrated in FIG. 1 or the semiconductor device 4 illustrated in FIG. 4. Meanwhile, the data storage circuit 1001 may include a nonvolatile memory that can retain any stored data even when its power supply is interrupted or turned off. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control operations for inputting data into the data storage circuit 1001 and the buffer memory 1003 or for outputting the data stored in the data storage circuit 1001 and the buffer memory 1003. The memory controller 1002 may include the controller 1 illustrated in FIG. 1 or the controller 3 illustrated in FIG. 4. Although FIG. 6 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store data which are processed by the memory controller 1002. For example, the buffer memory 1003 may temporarily store data which are outputted from the data storage circuit 1001. Also, the buffer memory 1003 may temporarily store data which are to be inputted to the data storage circuit 1001. The buffer memory 1003 may temporarily store the data according to a control signal from the memory controller 1002. The buffer memory 1003 may read and output the stored data to the memory controller 1002. The buffer memory 1003 may be or include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data outputted from the memory controller 1002 to the external device (i.e., the host) through the I/O interface 1004. That is, the electronic system 1000 may communicate with the host through the I/O interface 1004. The I/O interface 1004 may be implemented with any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may be configured as a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

Figure 7:
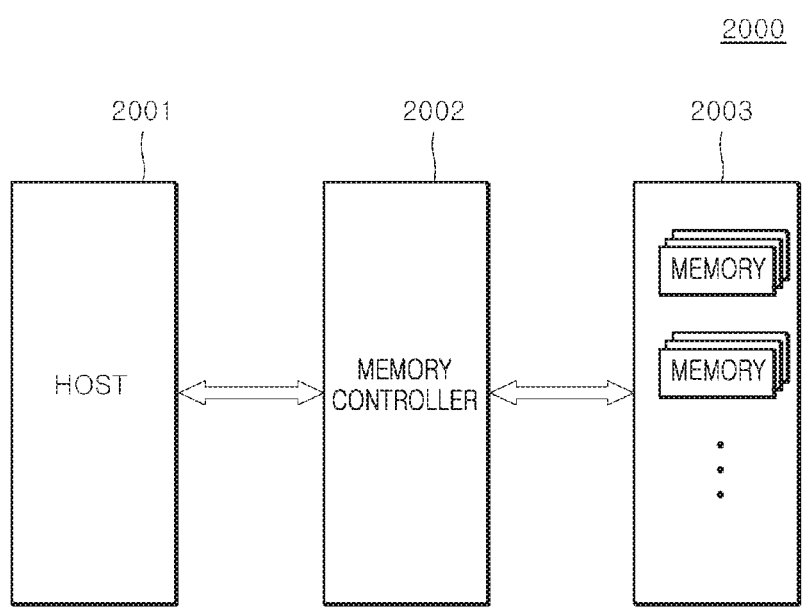
FIG. 7 is a block diagram illustrating a configuration of another electronic system employing at least one of the semiconductor modules shown in FIGS. 1 to 5.

Referring to FIG. 7, an electronic system 2000 according to another embodiment may include a host 2001, a memory controller 2002 and a data storage circuit 2003.

The host 2001 may output a request signal and data to the memory controller 2002 to gain access to the data storage circuit 2003. The memory controller 2002 may supply the data, a data strobe signal, a command, an address and a clock signal to the data storage circuit 2003 in response to the request signal, and the data storage circuit 2003 may execute a write operation or a read operation in response to the command. The host 2001 may transmit the data to the memory controller 2002 to store the data into the data storage circuit 2003. In addition, the host 2001 may receive the data from the data storage circuit 2003 through the memory controller 2002. The host 2001 may include a circuit that corrects errors of the data using an error correction code (ECC) scheme.

The memory controller 2002 may act as an interface that connects the host 2001 to the data storage circuit 2003 for communication between the host 2001 and the data storage circuit 2003. The memory controller 2002 may receive the request signal and the data from the host 2001 and may generate and supply the data, the data strobe signal, the command, the address and the clock signal to the data storage circuit 2003 in order to control one or more operations of the data storage circuit 2003. In addition, the memory controller 2002 may supply the data outputted from the data storage circuit 2003 to the host 2001. The memory controller 2002 may include the controller 1 illustrated in FIG. 1 or the controller 3 illustrated in FIG. 4.

The data storage circuit 2003 may include a plurality of memories. The data storage circuit 2003 may receive the data, the data strobe signal, the command, the address and the clock signal from the memory controller 2002 to execute the write operation or the read operation. Each of the memories included in the data storage circuit 2003 may include a circuit that corrects the errors of the data using an error correction code (ECC) scheme. The data storage circuit 2003 may include the semiconductor device 2 illustrated in FIG. 1 or the semiconductor device 4 illustrated in FIG. 4.

In some embodiments, the electronic system 2000 may be realized to selectively operate any one of the ECC circuits included in the host 2001 and the data storage circuit 2003. Alternatively, the electronic system 2000 may be realized to simultaneously operate all of the ECC circuits included in the host 2001 and the data storage circuit 2003. The host 2001 and the memory controller 2002 may be realized in a single chip according to various embodiments. The memory controller 2002 and the data storage circuit 2003 may be realized in a single chip according to various embodiments.

Although the present invention has been described in terms of specific embodiments, it is noted that many other embodiments and variations thereof may be envisaged by the skilled person in this art without departing from the scope and spirit of the present invention as defined in the appended claims.

What is claimed is:

1. A semiconductor module comprising:
a controller configured to control an error scrub operation and a read operation;
a semiconductor device including a plurality of memory chips and an error information signal generation circuit,
wherein at least one of the plurality of memory chips performs the error scrub operation during the read operation of the plurality of memory chips,
wherein the plurality of memory chips are configured to receive a command during the read operation to generate a plurality of error detection signals including pulses generated when an error occurs in the plurality of memory chips,
wherein the error information signal generation circuit is configured to generate a plurality of error information signals enabled when an error occurs a predetermined number of times in the plurality of memory chips.

2. The semiconductor module of claim 1, wherein the error scrub operation corrects an error of data stored in the at least one of the plurality of memory chips and restores the corrected data into the at least one of the plurality of memory chips.

3. The semiconductor module of claim 1,
wherein each of the plurality of memory chips includes an internal error correction circuit; and
wherein the internal error correction circuit included in the memory chip performing the error scrub operation does not correct erroneous data, and the erroneous data are corrected by an error correction circuit included in the controller.

4. The semiconductor module of claim 3,
wherein the internal error correction circuit is configured to correct at least two erroneous bits; and
wherein each of the internal error correction circuits is configured to correct a single erroneous bit.

5. The semiconductor module of claim 1, wherein the controller includes:
a command generation circuit configured to generate a command for the read operation and the error scrub operation;
an error scrub control circuit configured to generate first to fourth memory selection signals, at least one of which is selectively enabled in response to first to fourth error information signals; and
an error correction circuit configured to correct erroneous data of the at least one of the plurality of memory chips that performs the error scrub operation and configured to restore the corrected data into the at least one of the plurality of memory chips.

6. The semiconductor module of claim 1,
wherein the plurality of memory chips include a first memory chip, a second memory chip, a third memory chip and a fourth memory chip;
wherein the plurality of error detection signals include a first error detection signal, a second error detection signal, third error detection signal and fourth error detection signal;
wherein the first memory chip is configured to include a first internal error correction circuit and is configured to receive the command to generate the first error detection signal including a pulse which is created if an error of first data outputted from the first memory chip occurs during the read operation;
wherein the second memory chip is configured to include a second internal error correction circuit and is configured to receive the command to generate the second error detection signal including a pulse which is created if an error of second data outputted from the second memory chip occurs during the read operation;
wherein the third memory chip is configured to include a third internal error correction circuit and is configured to receive the command to generate the third error detection signal including a pulse which is created if an error of third data outputted from the third memory chip occurs during the read operation;
wherein the fourth memory chip is configured to include a fourth internal error correction circuit and is configured to receive the command to generate the fourth error detection signal including a pulse which is created if an error of fourth data outputted from the fourth memory chip occurs during the read operation; and wherein the error information signal generation circuit is configured to generate first to fourth error information signals, one of which is enabled when a pulse of any one of the first to fourth error detection signals is created by at least a predetermined number of times.

7. The semiconductor module of claim 6, wherein the first internal error correction circuit is configured to perform the read operation or the error scrub operation in response to a first memory selection signal;

wherein the second internal error correction circuit is configured to perform the read operation or the error scrub operation in response to a second memory selection signal;

wherein the third internal error correction circuit is configured to perform the read operation or the error scrub operation in response to a third memory selection signal; and wherein the fourth internal error correction circuit is configured to perform the read operation or the error scrub operation in response to a fourth memory selection signal.

8. The semiconductor module of claim 6, wherein the error information signal generation circuit includes:

a first counter configured to receive a reference information signal to generate the first error information signal which is enabled when a pulse of the first error detection signal is created at least the predetermined number of times;

a second counter configured to receive the reference information signal to generate the second error information signal which is enabled when a pulse of the second error detection signal is created at least the predetermined number of times;

a third counter configured to receive the reference information signal to generate the third error information signal which is enabled when a pulse of the third error detection signal is created at least the predetermined number of times; and a fourth counter configured to receive the reference information signal to generate the fourth error information signal which is enabled when a pulse of the fourth error detection signal is created at least the predetermined number of times.

9. The semiconductor module of claim 6, wherein the error information signal generation circuit includes:

a count signal generation circuit configured to generate first to fourth count signals that are counted in response to the pulses of the first to fourth error detection signals; and a comparison circuit configured to compare the first to fourth count signals with a reference information signal including information on the predetermined number of times to generate the first to fourth error information signals.

10. The semiconductor module of claim 9, wherein the count signal generation circuit includes:

a first counter configured to generate the first count signal that is counted in response to a pulse of the first error detection signal;

a second counter configured to generate the second count signal that is counted in response to a pulse of the second error detection signal;

a third counter configured to generate the third count signal that is counted in response to a pulse of the third error detection signal; and a fourth counter configured to generate the fourth count signal that is counted in response to a pulse of the fourth error detection signal.

11. The semiconductor module of claim 1, wherein the plurality of memory chips of the semiconductor device sequentially perform the error scrub operation.

12. The semiconductor module of claim 11, wherein the controller includes:

a command generation circuit configured to generate a command for the read operation and the error scrub operation;

an error scrub control circuit configured to generate first to fourth memory selection signals which are sequentially enabled in response to first to fourth operation detection signals; and an error correction circuit configured to correct erroneous data of a certain one of the plurality of memory chips that performs the error scrub operation and configured to restore the corrected data into the certain one of the plurality of memory chips.

13. The semiconductor module of claim 12, wherein the error scrub control circuit generates the first memory selection signal which is enabled when the fourth operation detection signal is inputted to the error scrub control circuit;

wherein the error scrub control circuit generates the second memory selection signal which is enabled when the first operation detection signal is inputted to the error scrub control circuit;

wherein the error scrub control circuit generates the third memory selection signal which is enabled when the second operation detection signal is inputted to the error scrub control circuit; and wherein the error scrub control circuit generates the fourth memory selection signal which is enabled when the third operation detection signal is inputted to the error scrub control circuit.

14. The semiconductor module of claim 11, wherein the plurality of memory chips include a first memory chip, a second memory chip, a third memory chip and a fourth memory chip;

wherein the semiconductor device further includes an operation detection signal generation circuit in addition to the first to fourth memory chips;

wherein the first memory chip is configured to include a first internal error correction circuit and is configured to output first data during the read operation in response to a command and to generate a first operation start signal which is enabled at a point of time that the error scrub operation starts;

wherein the second memory chip is configured to include a second internal error correction circuit and is configured to output second data during the read operation in response to the command and to generate a second operation start signal which is enabled at a point of time that the error scrub operation starts;

wherein the third memory chip is configured to include a third internal error correction circuit and is configured to output third data during the read operation in response to the command and to generate a third operation start signal which is enabled at a point of time that the error scrub operation starts;

wherein the fourth memory chip is configured to include a fourth internal error correction circuit and is configured to output fourth data during the read operation in response to the command and to generate a fourth operation start signal which is enabled at a point of time that the error scrub operation starts; and wherein the operation detection signal generation circuit is configured to generate first to fourth operation detection signals which are sequentially enabled in response to the first to fourth operation start signals.

15. The semiconductor module of claim 14,
wherein the first internal error correction circuit is configured to perform the read operation or the error scrub operation in response to a first memory selection signal;
wherein the second internal error correction circuit is configured to perform the read operation or the error scrub operation in response to a second memory selection signal;
wherein the third internal error correction circuit is configured to perform the read operation or the error scrub operation in response to a third memory selection signal; and
wherein the fourth internal error correction circuit is configured to perform the read operation or the error scrub operation in response to a fourth memory selection signal.

16. The semiconductor module of claim 14, wherein the operation detection signal generation circuit includes:
a first timer configured to generate the first operation detection signal which is enabled after a predetermined period from a point of time that the first operation start signal is inputted to the first timer;
a second timer configured to generate the second operation detection signal which is enabled after the predetermined period from a point of time that the second operation start signal is inputted to the second timer;
a third timer configured to generate the third operation detection signal which is enabled after the predetermined period from a point of time that the third operation start signal is inputted to the third timer; and
a fourth timer configured to generate the fourth operation detection signal which is enabled after the predetermined period from a point of time that the fourth operation start signal is inputted to the fourth timer.

17. A semiconductor module comprising:
a controller configured to control an error scrub operation and a read operation; and
a semiconductor device including a plurality of memory chips,
wherein at least one of the plurality of memory chips performs the error scrub operation during the read operation of the plurality of memory chips,
wherein the plurality of memory chips are configured to receive a command during the read operation to generate a plurality of error detection signals including pulses generated when an error occurs in the plurality of memory chips,
wherein the plurality of memory chips include a first memory chip, a second memory chip, a third memory chip and a fourth memory chip;
wherein the semiconductor device further includes an error information signal generation circuit in addition to the first to fourth memory chips;
wherein the plurality of error detection signals include a first error detection signal, a second error detection signal, third error detection signal and fourth error detection signal;
wherein the first memory chip is configured to include a first internal error correction circuit and is configured to receive the command to generate the first error detection signal including a pulse which is created if an error of first data outputted from the first memory chip occurs during the read operation;
wherein the second memory chip is configured to include a second internal error correction circuit and is configured to receive the command to generate the second error detection signal including a pulse which is created if an error of second data outputted from the second memory chip occurs during the read operation;
wherein the third memory chip is configured to include a third internal error correction circuit and is configured to receive the command to generate the third error detection signal including a pulse which is created if an error of third data outputted from the third memory chip occurs during the read operation;
wherein the fourth memory chip is configured to include a fourth internal error correction circuit and is configured to receive the command to generate the fourth error detection signal including a pulse which is created if an error of fourth data outputted from the fourth memory chip occurs during the read operation; and
wherein the error information signal generation circuit is configured to generate first to fourth error information signals, one of which is enabled when a pulse of any one of the first to fourth error detection signals is created by at least a predetermined number of times.

18. A semiconductor module comprising:
a controller configured to control an error scrub operation and a read operation; and
a semiconductor device including a plurality of memory chips,
wherein at least one of the plurality of memory chips performs the error scrub operation during the read operation of the plurality of memory chips,
wherein the plurality of memory chips are configured to receive a command during the read operation to generate a plurality of error detection signals including pulses generated when an error occurs in the plurality of memory chips,
wherein the controller includes:
a command generation circuit configured to generate a command for the read operation and the error scrub operation;
an error scrub control circuit configured to generate first to fourth memory selection signals which are sequentially enabled in response to first to fourth operation detection signals; and
an error correction circuit configured to correct erroneous data of a certain one of the plurality of memory chips that performs the error scrub operation and configured to restore the corrected data into the certain one of the plurality of memory chips,
wherein the error scrub control circuit generates the first memory selection signal which is enabled when the fourth operation detection signal is inputted to the error scrub control circuit;
wherein the error scrub control circuit generates the second memory selection signal which is enabled when the first operation detection signal is inputted to the error scrub control circuit;
wherein the error scrub control circuit generates the third memory selection signal which is enabled when the second operation detection signal is inputted to the error scrub control circuit; and wherein the error scrub control circuit generates the fourth memory selection signal which is enabled when the third operation detection signal is inputted to the error scrub control circuit.

* * * * *